(12) United States Patent
Nakajima et al.

(10) Patent No.: US 9,640,269 B2
(45) Date of Patent: May 2, 2017

(54) SEMICONDUCTOR MEMORY DEVICE

(71) Applicant: KABUSHIKI KAISHA TOSHIBA, Minato-ku (JP)

(72) Inventors: Yasushi Nakajima, Kawasaki (JP); Hideaki Yamamoto, Yokosuka (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 14/991,104

(22) Filed: Jan. 8, 2016

(65) Prior Publication Data

US 2017/0062061 A1    Mar. 2, 2017

Related U.S. Application Data

(60) Provisional application No. 62/210,714, filed on Aug. 27, 2015.

(51) Int. Cl.
| | |
|---|---|
| *G11C 16/10* | (2006.01) |
| *G11C 16/22* | (2006.01) |
| *G11C 16/26* | (2006.01) |
| *G11C 16/16* | (2006.01) |
| *G11C 29/02* | (2006.01) |

(52) U.S. Cl.
CPC ............ *G11C 16/22* (2013.01); *G11C 16/10* (2013.01); *G11C 16/16* (2013.01); *G11C 16/26* (2013.01); *G11C 29/02* (2013.01)

(58) Field of Classification Search
CPC ................................ G11C 16/10; G11C 16/08
USPC ........................................ 365/185.11, 185.24
See application file for complete search history.

(56) References Cited

U.S. PATENT DOCUMENTS

| | | | | |
|---|---|---|---|---|
| 5,157,335 A | * | 10/1992 | Houston | G06F 11/004 324/537 |
| 5,495,448 A | * | 2/1996 | Sachdev | G11C 8/04 365/194 |
| 7,945,825 B2 | * | 5/2011 | Cohen | G06F 11/1072 714/721 |
| 8,514,630 B2 | | 8/2013 | Huynh et al. | |
| 8,526,241 B2 | | 9/2013 | Shirakawa | |
| 8,693,254 B2 | | 4/2014 | Hashimoto | |

(Continued)

FOREIGN PATENT DOCUMENTS

| | | |
|---|---|---|
| JP | 2013-530484 | 7/2013 |
| JP | 2013-157050 | 8/2013 |

(Continued)

*Primary Examiner* — Michael Tran
(74) *Attorney, Agent, or Firm* — Oblon, McClelland, Maier & Neustadt, L.L.P.

(57) ABSTRACT

A semiconductor memory device according to an embodiment comprises: a memory cell array, the memory cell array including a memory block, the memory block including a memory cell, the memory cell including a semiconductor layer, a conductive layer, and a charge accumulation layer, the charge accumulation layer being disposed between the semiconductor layer and the conductive layer; and a control circuit that executes an access operation on the memory cell, the control circuit, triggered by the access operation, detecting a leak current of the conductive layer, and when the leak current is a certain value or more, executing a faulty memory block processing that registers as an access-prohibited region the memory block including the conductive layer.

19 Claims, 7 Drawing Sheets

(56) References Cited

U.S. PATENT DOCUMENTS 8,902,657 B2  12/2014  Iwai et al.
2009/0213674 A1*  8/2009  Koeppe .................... G11C 8/08
                                                              365/203

FOREIGN PATENT DOCUMENTS

JP          5377526      12/2013
JP          2014-53061    3/2014

* cited by examiner

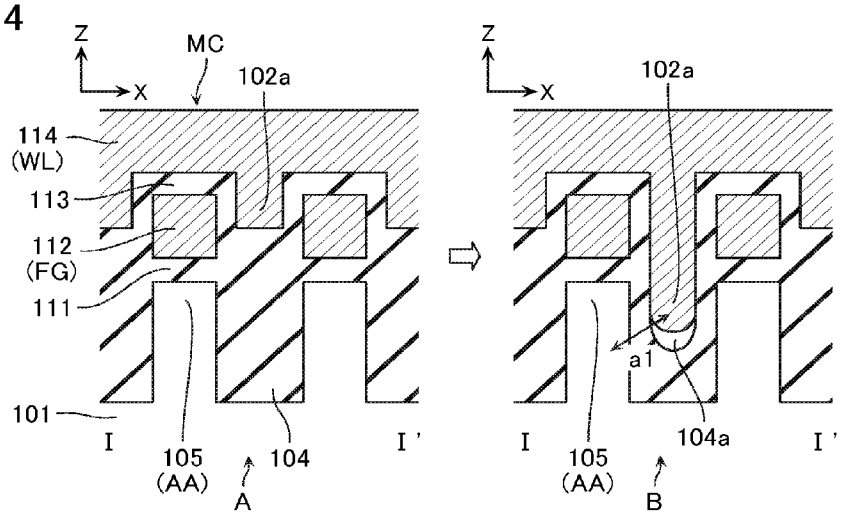
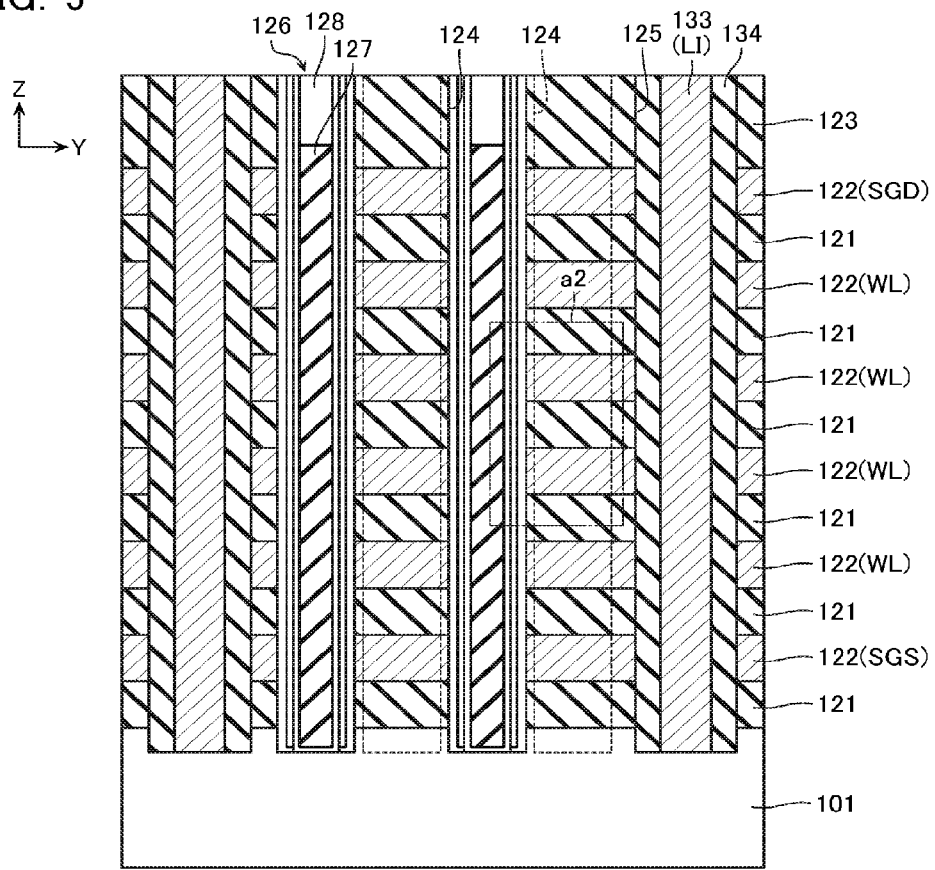

SEMICONDUCTOR MEMORY DEVICE

CROSS-REFERENCE TO RELATED APPLICATIONS

This application is based upon and claims the benefit of priority from the prior U.S. Provisional Application 62/210,714, filed on Aug. 27, 2015, the entire contents of which are incorporated herein by reference.

BACKGROUND

Field

Embodiments of the present invention relate to a semiconductor memory device.

Description of the Related Art

In semiconductor memory devices typified by NAND type flash memories, the miniaturization of memory cells of recent years has given rise to a problem of short-circuit faults between wiring lines or between a wiring line and a semiconductor substrate. Normally, such short-circuit faults are processed in a pre-shipment test step. However, in the pre-shipment test step, it is difficult to deal with a highly probable defect that although not being a short-circuit fault, ends up being a short-circuit fault triggered by the likes of use by a user.

BRIEF DESCRIPTION OF THE DRAWINGS

FIG. 4 is a cross-sectional view of a memory cell of the semiconductor memory device according to the same embodiment.

FIG. 5 is a cross-sectional view of another memory cell array of the semiconductor memory device according to the same embodiment.

DETAILED DESCRIPTION

A semiconductor memory device according to an embodiment comprises: a memory cell array, the memory cell array including a memory block, the memory block including a memory cell, the memory cell including a semiconductor layer, a conductive layer, and a charge accumulation layer, the charge accumulation layer being disposed between the semiconductor layer and the conductive layer; and a control circuit that executes an access operation on the memory cell, the control circuit, triggered by the access operation, detecting a leak current of the conductive layer, and when the leak current is a certain value or more, executing a faulty memory block processing that registers as an access-prohibited region the memory block including the conductive layer.

Semiconductor memory devices according to embodiments will be described below with reference to the drawings.

First Embodiment

First, an overall configuration of a semiconductor memory device according to a first embodiment will be described.

Figure 1:
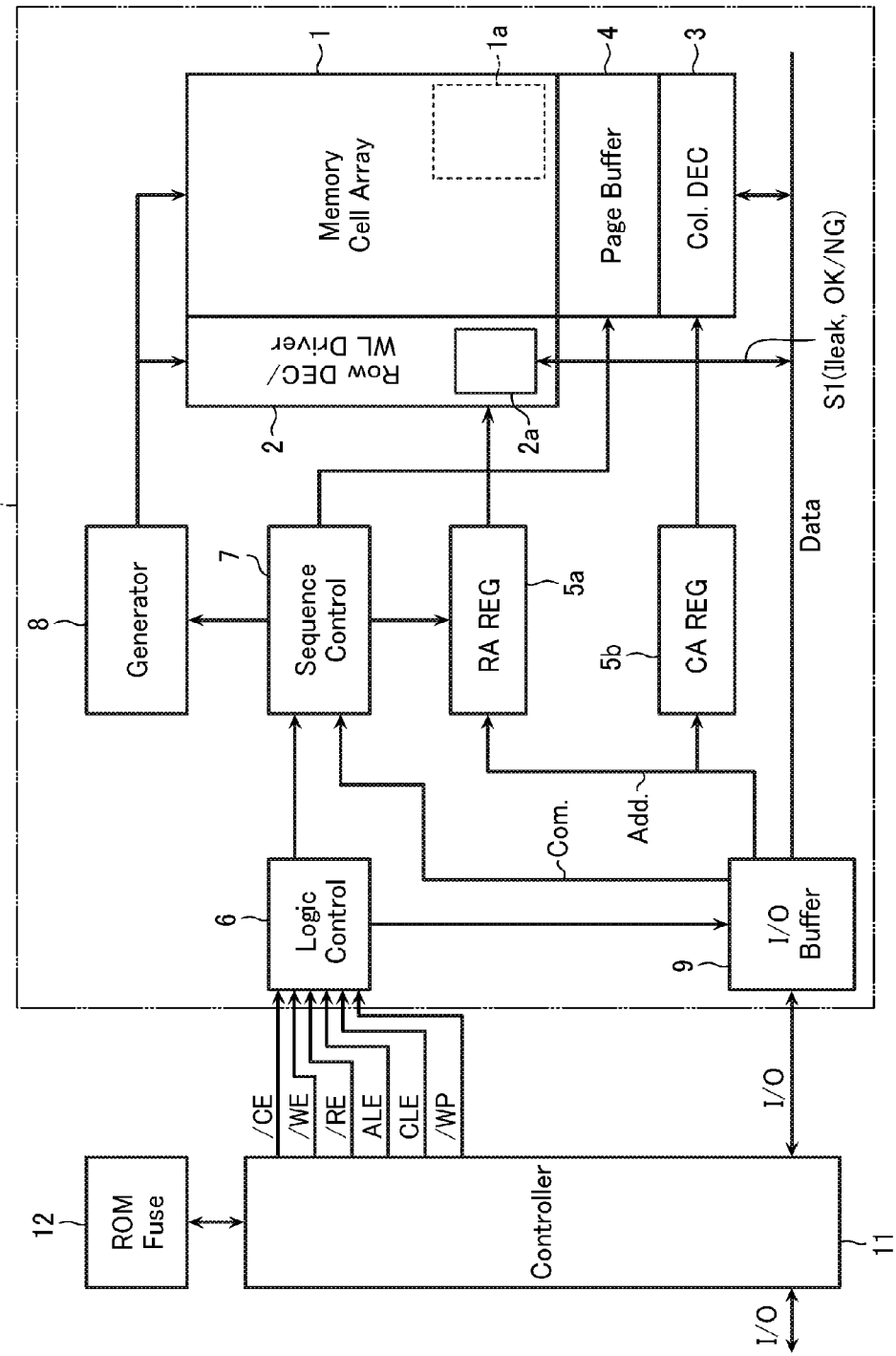
FIG. 1 is a functional block diagram of a semiconductor memory device according to a first embodiment.

FIG. 1 is a functional block diagram of the semiconductor memory device according to the present embodiment.

This semiconductor memory device is a NAND type flash memory and comprises: a NAND chip 10; a controller 11 that controls this NAND chip 10; and a ROM fuse 12 that stores various kinds of information required for access to the NAND chip 10.

The NAND chip 10 comprises a memory cell array 1. The memory cell array 1 includes a plurality of bit lines extending in a column direction (Y direction), a plurality of word lines and a source line extending in a row direction (X direction), and a plurality of memory cells selected by the bit line and the word line. A group of memory cells selected by one word line configures a page. Data write/read of the flash memory is performed in a unit of the page. The memory cell array 1 includes a management information storage region 1a that stores an access-prohibited region of the memory cell array. The memory cell array 1 will be described later.

In addition, the NAND chip 10 comprises a control circuit that executes: a write operation which is a series of processings that write data to the memory cell; an erase operation which is a series of processings that erase data of the memory cell; and a read operation which is a series of processings that read data from the memory cell. The control circuit includes: a row decoder/word line driver 2; a column decoder 3; a page buffer 4; a row address register 5a and column address register 5b; a logic control circuit 6; a sequence control circuit 7; a voltage generating circuit 8; and an I/O buffer 9.

The row decoder/word line driver 2 drives the word line and a later-mentioned select gate line of the memory cell array 1. In addition, the row decoder/word line driver 2 includes a leak current detecting circuit 2a. The leak current detecting circuit 2a detects a leak current Ileak accompanying a short-circuit fault between fellow word lines or between a semiconductor substrate and the word line during an access operation (sometimes also referred to below simply as "leak current of the word line"), and outputs to outside of the control circuit a detection signal S1 which is a detection result. The detection signal S1 is a signal indicating a value of the leak current Ileak itself, or is a binary (OK/NG) signal determined by a magnitude relationship of the leak current Ileak and a certain value Ya. Note that the leak current detecting circuit 2a is not limited to being within the row decoder/word line driver 2, and may be included in another configuration of the control circuit.

The page buffer 4 includes a one page portion of sense amplifier circuits and latch circuits. A one page portion of read data stored by the page buffer 4 is sequentially column selected by the column decoder 3 to be outputted to an external I/O terminal via the I/O buffer 9. Write data supplied from the I/O terminal is selected by the column decoder 3 to be loaded into the page buffer 4. The page buffer 4 is loaded with a one page portion of write data. Row and column address signals are inputted via the I/O buffer 9 and transferred to the row decoder/word line driver 2 and column decoder 3, respectively. The row address register 5a stores an erase block address in the case of data erase, and stores a page address in the case of data write/read. The column address register 5b is inputted with a leading column address for loading write data before start of a write operation, or a leading column address for a read operation. The column address register 5b stores the inputted column address until a write enable signal /WE or a read enable signal /RE is toggled by a certain condition.

The logic control circuit 6 controls input of a command or an address, and input/output of data, based on control signals such as a chip enable signal /CE, a command latch enable signal CLE, an address latch enable signal ALE, the write enable signal /WE, the read enable signal /RE, and a write protect signal /WP. The sequence control circuit 7 receives a command from the logic control circuit 6, and controls the write operation, the erase operation, and the read operation based on this command. The voltage generating circuit 8 is controlled by the sequence control circuit 7 to generate certain voltages required for various operations.

The controller 11 controls the read operation and the write operation by conditions appropriate to a current write state of the NAND chip 10. Note that part of the read operation and the write operation may also be controlled by the control circuit of the NAND chip 10.

Next, the memory cell array 1 will be described.

Figure 2:
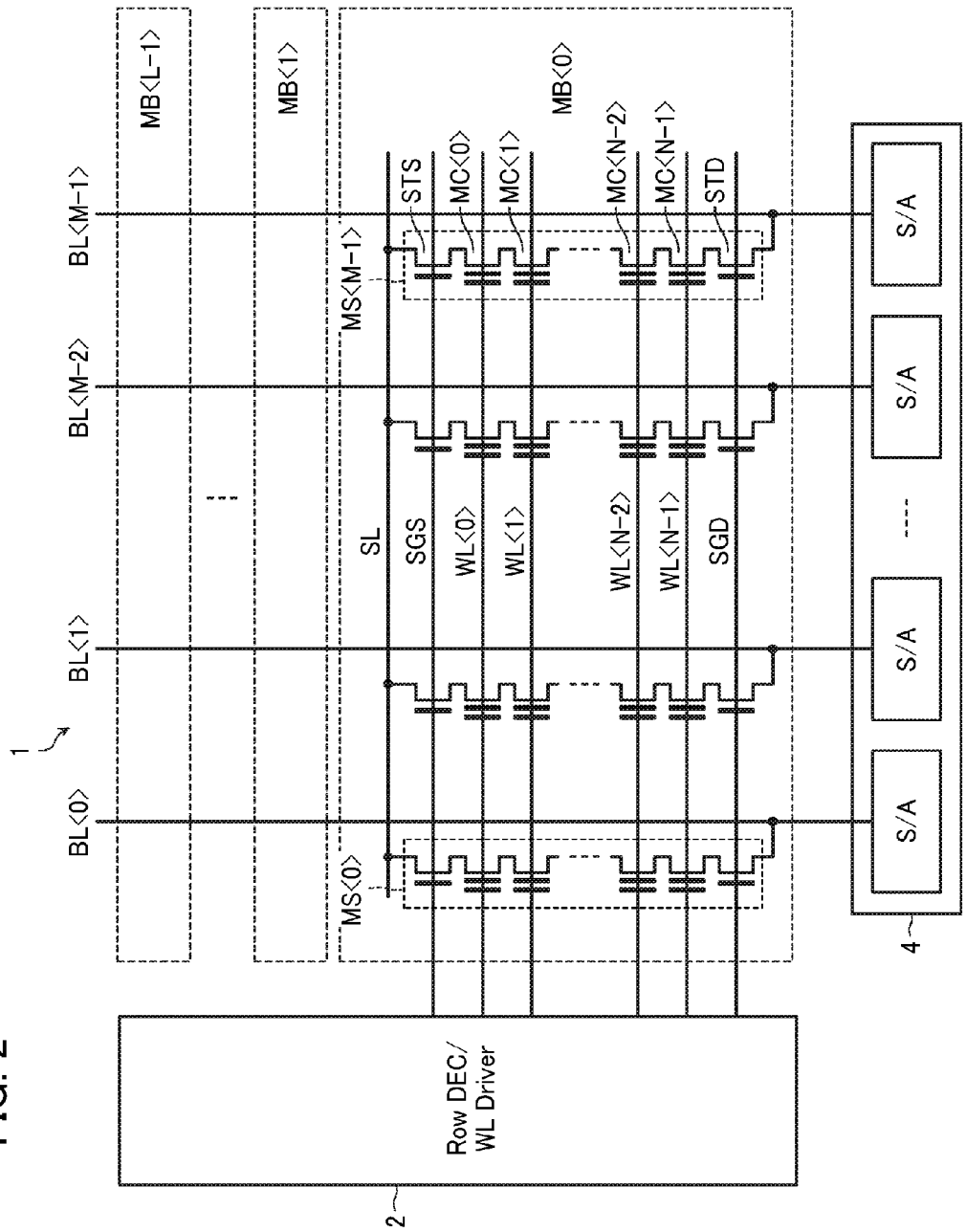
FIG. 2 is a circuit diagram of a memory cell array of the semiconductor memory device according to the same embodiment.

FIG. 2 is a circuit diagram of the memory cell array of the semiconductor memory device according to the present embodiment.

The memory cell array 1 includes: word lines WL<0> to WL<N−1>, a source side select gate line SGS, a drain side select gate line SGD, and a source line SL that extend in the row direction; bit lines BL<0> to BL<M−1> that extend in the column direction; and memory strings MS<0> to MS<M−1> provided corresponding to each of the bit lines BL<0> to BL<M−1>. Each of the memory strings MS includes N memory cells MC<0> to MC<N−1> connected in series, and a source side select transistor STS and a drain side select transistor STD connected to the two ends of the series-connected memory cells MC<0> to MC<N−1>. Each of the memory cells MC is a transistor having a semiconductor layer, a control gate, and a charge accumulation layer which is disposed between the semiconductor layer and the control gate. In addition, the select transistors STS and STD are transistors having a semiconductor layer and a control gate which faces the semiconductor layer. Note that a transistor having a similar structure to that of a memory cell MC whose charge accumulation layer and control gate have been short-circuited, is also sometimes utilized in the select transistors STS and STD.

A source of the select transistor STS is connected to the source line SL. A drain of the select transistor STD is connected to one of the bit lines BL<0> to BL<M−1>. Control gates of the memory cells MC<0> to MC<N−1> are connected to the word lines WL<0> to WL<N−1>. Control gates of the select transistors STS and STD are connected to the select gate lines SGS and SGD.

In the above-described configuration, the M memory strings MS aligned in the row direction configure one memory block MB. The memory cell array 1 includes L memory blocks MB<0> to MB<L−1> aligned in the column direction. Data erase of the flash memory is performed in a unit of this memory block.

The word lines WL and the select gate lines SGS and SGD are respectively driven by the row decoder/word line driver 2. Moreover, the bit lines BL are respectively connected to sense amplifier circuits S/A of the page buffer 4.

Next, structures of the memory cell array 1 and the memory cell MC will be described.

Figure 3:
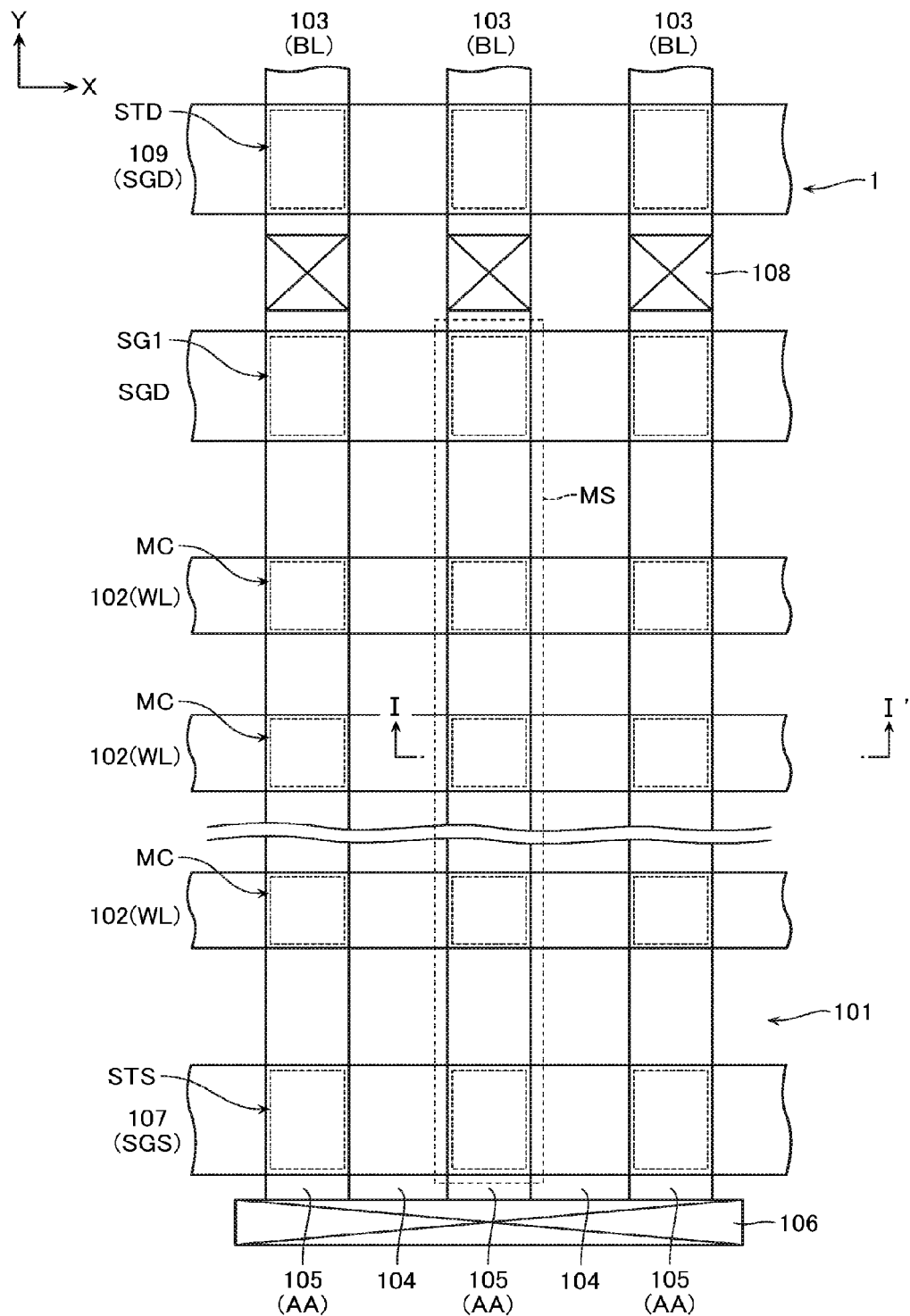
FIG. 3 is a plan view showing a layout of the memory cell array of the semiconductor memory device according to the same embodiment.

FIG. 3 is a plan view showing a layout of the memory cell array of the semiconductor memory device according to the present embodiment; and FIG. 4 is a cross-sectional view of the memory cell of the same semiconductor memory device. FIG. 4 is a cross-sectional view looking in the I-I' direction shown in FIG. 3.

The memory cell array 1 of FIG. 3 is disposed on a semiconductor substrate 101 and comprises: a plurality of word lines 102 (WL) extending in the X direction; a plurality of bit lines 103 (BL) extending in the Y direction; and the memory cell MC disposed at each of intersections of those plurality of word lines WL and plurality of bit lines BL.

The source side select transistor STS, a plurality of the memory cells MC, and the drain side select transistor STD aligned in the Y direction are connected in series to configure one memory string MS. The semiconductor substrate 101 where the memory cell MC is formed is isolated into a plurality of active areas 105 (AA) by an element isolation insulating layer 104 formed having the Y direction as its longitudinal direction. The memory string MS is formed along this active area AA. A plurality of the memory strings MS aligned in the X direction are commonly connected to an identical word line WL and configure one memory block MB. The memory block MB is a minimum unit of the erase operation. Note that it is also possible for one or more dummy cells not employed in data storage to be disposed at least one of between the source side select transistor STS and the memory cell MC and between the memory cell MC and the drain side select transistor STD, of the memory string MS.

The source of the source side select transistor STS of the memory string MS is connected to the source line SL (not illustrated in FIG. 3) via a source side contact 106. Moreover, a gate of the source side select transistor STS is connected to a source side select gate line 107 (SGS) extending in the X direction. On the other hand, the drain of the drain side select transistor STD of the memory string MS is connected to the bit line BL via a drain side contact 108. Moreover, a gate of the drain side select transistor STD is connected to a drain side select gate line 109 (SGD) extending in the X direction.

In the memory cell array 1 of FIG. 3, the memory cell MC has the structure of A in FIG. 4, for example. In other words, as shown in A of FIG. 4, the memory cell MC includes: a floating gate 112 (FG) being the charge accumulation layer stacked in a Z direction, via a tunnel insulating layer 111, on the semiconductor substrate 101; and the word line WL being a control gate CG stacked in the Z direction, via a block insulating layer 113, on the floating gate FG. The semiconductor substrate 101 is configured from silicon (Si), for example. Moreover, the semiconductor substrate 101 includes in an upper portion thereof a plurality of the element isolation insulating layers 104 having the Z direction as their depth direction and extending in the Y direction, and has the active area AA formed between the element isolation insulating layers 104. The element isolation insulating layer 104 is configured from silicon oxide ($SiO_2$), for example. The tunnel insulating layer 111 is configured from silicon oxide (SiO$_2$), for example. The floating gate FG is configured from polysilicon (Poly-Si), for example. The block insulating layer 113 is configured from silicon oxide (SiO$_2$), for example. The word line WL extends in the X direction and is configured from tungsten (W), for example. The word line WL has on a bottom surface thereof a protruding portion 102*a* that penetrates between the memory cells MC adjacent in the X direction. This makes it possible for the word line WL to have a large facing area to an upper surface and a side surface of the floating gate FG. As a result, electrostatic capacitance between the floating gate FG and the word line WL increases, and fast processing of data write and data erase on the memory cell MC are enabled.

However, in the case of the structure of A in FIG. 4, attention must be paid to the following problem. In other words, in a formation step of the memory cell MC, a cavity 104*a* sometimes ends up entering the element isolation insulating layer 104 during deposition of the element isolation insulating layer 104. In this case, the protruding portion 102*a* of the word line WL subsequently stacked ends up penetrating the cavity 104*a*, and as a result, as shown by the arrow a1 of B in FIG. 4, the protruding portion 102*a* and the semiconductor substrate 101 come close, and in the worst case, a short-circuit fault or withstand voltage deficiency occurs between the two. In this case, the memory block MB in which this memory cell MC is included undergoes a processing such as access-prohibition, as a faulty memory block.

Next, other structures of the memory cell array 1 and the memory cell MC will also be described.

Figure 6:
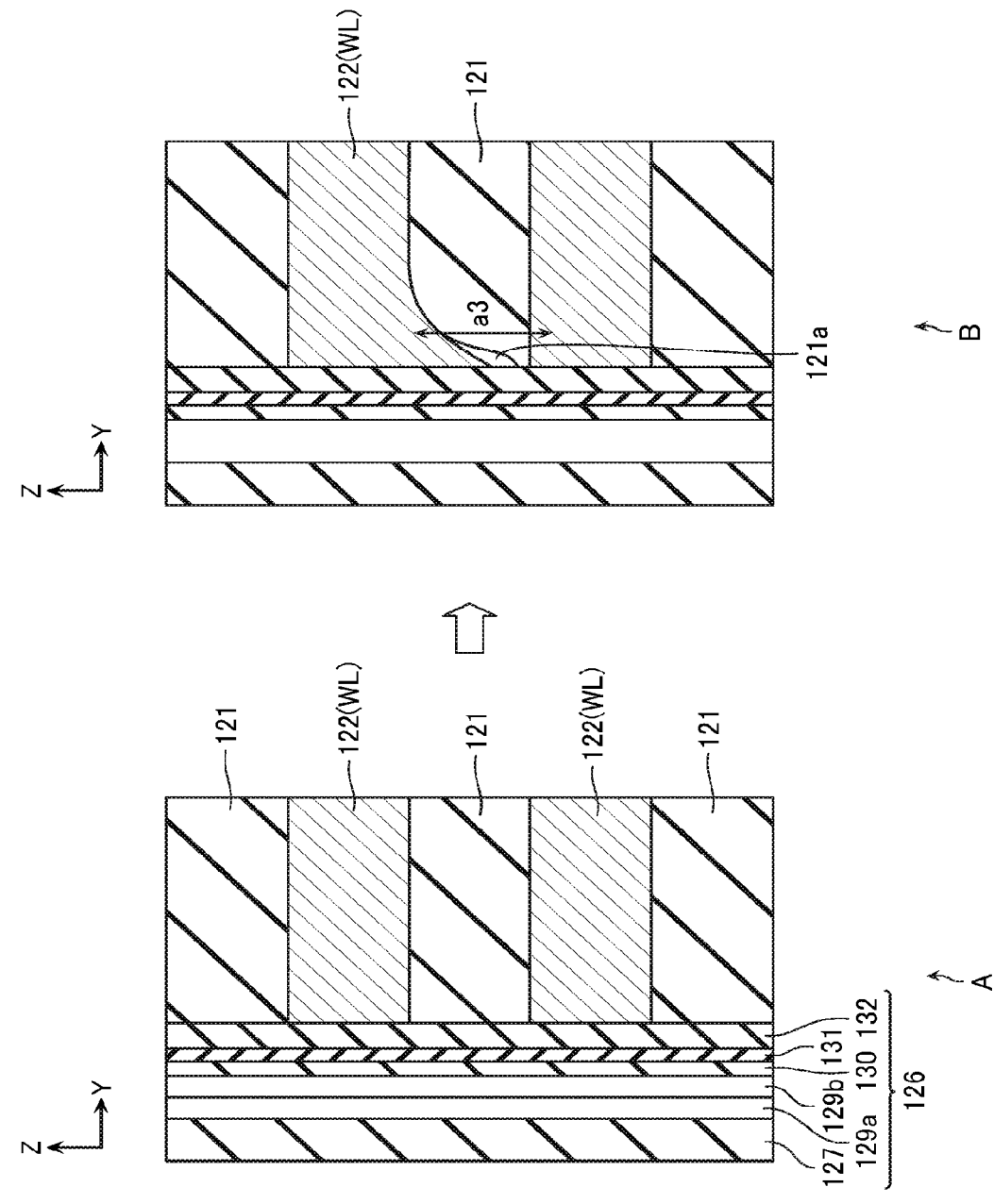
FIG. 6 is a cross-sectional view of another memory cell of the semiconductor memory device according to the same embodiment.

FIG. 5 is a cross-sectional view of another memory cell array of the semiconductor memory device according to the present embodiment; and FIG. 6 is a cross-sectional view of the memory cell of the same semiconductor memory device. FIG. 6 is a cross-sectional view enlarging the region a2 surrounded by the two dot-chain line of FIG. 5.

The memory cell array 1 of FIG. 5 includes: a plurality of inter-layer insulating layers 121 and conductive layers 122 stacked alternately in the Z direction on the semiconductor substrate 101; and an inter-layer insulating layer 123 stacked in the Z direction on the conductive layer 122. The inter-layer insulating layers 121 and 123 are configured from silicon oxide (SiO$_2$), for example. The plurality of conductive layers 122 are configured from tungsten (W), for example, and function as the source side select gate line SGS, the plurality of word lines WL, and the drain side select gate line SGD. In addition, the memory cell array 1 has: a plurality of memory holes 124 penetrating in the Z direction from the uppermost layer inter-layer insulating layer 123 to the lowermost layer inter-layer insulating layer 121 and reaching a semiconductor substrate 101 upper surface; and a trench 125 having the Z direction as its depth direction and extending in the X direction so as to sandwich the plurality of memory holes 124.

The memory hole 124 is implanted with a memory columnar body 126. The memory columnar body 126 includes: a core insulating layer 127 in a center of the memory columnar body 126; and a cap semiconductor layer 128 stacked in the Z direction on the core insulating layer 127. The core insulating layer 127 is configured from silicon oxide (SiO$_2$), for example. The cap semiconductor layer 128 is configured from silicon (Si), for example. Moreover, as shown in A in FIG. 6, the memory columnar body 126 includes the following, disposed in concentric cylindrical shapes from side surfaces of the core insulating layer 127 and the cap semiconductor layer 128 to a side surface of the conductive layer 122, namely: semiconductor layers 129*a* and 129*b*; a tunnel insulating layer 130; a charge accumulation layer 131; and a block insulating layer 132. The semiconductor layers 129*a* and 129*b* function as a channel of the memory cell MC and are configured from polysilicon (Poly-Si), for example. The tunnel insulating layer 130 is configured from silicon oxide (SiO$_2$), for example. The charge accumulation layer 131 is configured from a material capable of charge accumulation such as silicon nitride (Si$_3$N$_4$), for example. The block insulating layer 132 is configured from silicon oxide (SiO$_2$), for example. One memory columnar body 126 configures one memory string MS, and intersections between the semiconductor layers 129*a* and 129*b* and conductive layer 122 function as the source side select transistor STS, the plurality of memory cells MC, and the drain side select transistor STD.

The trench 125 is implanted with: a conductive layer 133; and an insulating layer 134 disposed between a side surface of the trench 125 and the conductive layer 133. The conductive layer 133 functions as a source contact LI electrically connecting the semiconductor substrate 101 and the source line SL, and is configured from tungsten (W), for example. The insulating layer 134 is configured from silicon oxide (SiO$_2$), for example.

In the structure of the memory cell array 1 of FIG. 5, the memory string MS is formed in the Z direction, hence a size per one cell is smaller than in the structure of the memory cell array 1 of FIG. 3.

However, in the case of the structure of A in FIG. 6, attention must be paid to the following problem. In other words, the memory cell array 1 is formed by a plurality of the inter-layer insulating layers 121 and sacrifice layers being stacked on the semiconductor substrate 101, and then the sacrifice layer being removed to be replaced by the conductive layer 122. However, in the case that a cavity (Void) 121*a* has got formed on a side surface of the inter-layer insulating layer 121 during removal of the sacrifice layer, the conductive layer 122 ends up penetrating that cavity 121*a*, and as a result, as shown by the arrow a3 of B in FIG. 6, another conductive layer 122 comes close, and in the worst case, a short-circuit fault or withstand voltage deficiency occurs between the two. In this case, the memory block MB in which these short-circuited places are included undergoes a processing such as access-prohibition, as a faulty memory block.

The above kind of short-circuit faults and so on between fellow word lines WL or between the semiconductor substrate 101 and the word line WL occurring in the memory cell array 1 are found by detecting a leak current of the word line WL in a pre-shipment test. However, sometimes, a defect of the memory cell array 1 that could not be said to be a short-circuit fault or the like in the pre-shipment test ends up deteriorating to a short-circuit fault or the like as a result of degradation of structure due to use by a user, and so on. Moreover, in the pre-shipment test, it is difficult for this kind of highly probable defect such as a short-circuit fault to be revealed. Accordingly, in the present embodiment, in order to handle short-circuit faults and so on of the word lines WL that have occurred after use by the user, the semiconductor memory device is operated by the following flow.

Figure 7:
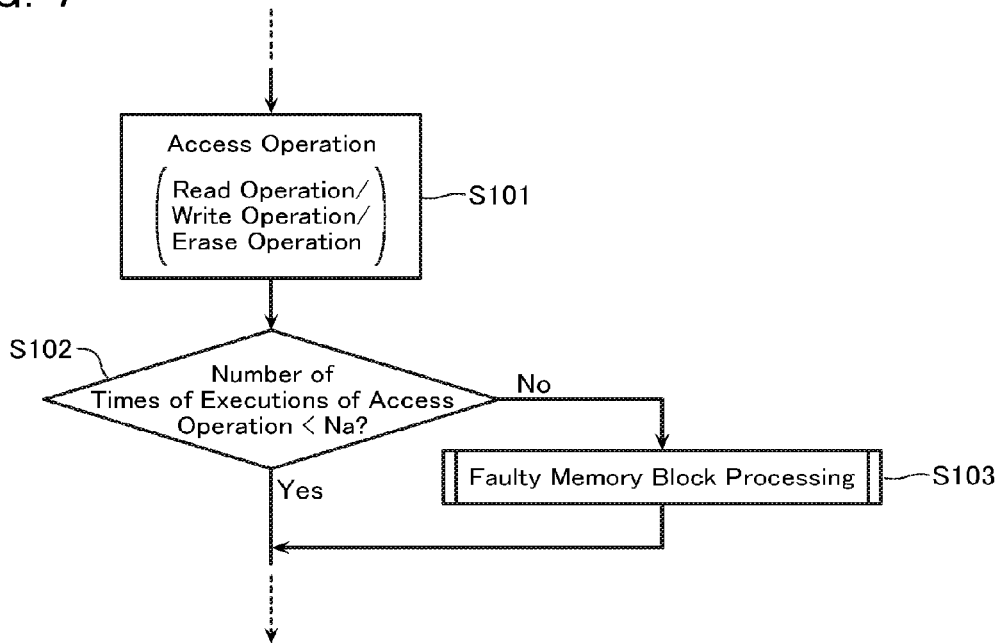
FIG. 7 is a flowchart including faulty memory block processing in the semiconductor memory device according to the same embodiment.
Figure 8:
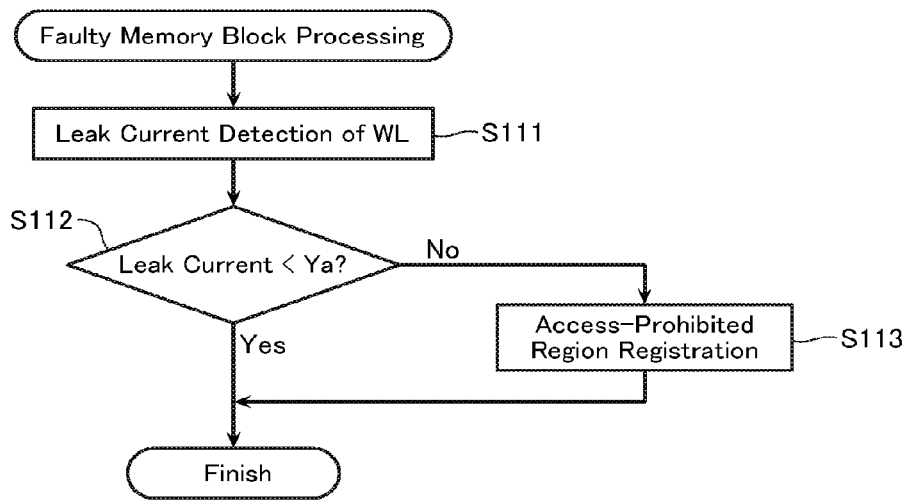
FIG. 8 is a flowchart of faulty memory block processing in the semiconductor memory device according to the same embodiment.

FIGS. 7 and 8 are flowcharts including faulty memory block processing in the semiconductor memory device according to the present embodiment.

First, in step S101, an access operation on the memory cell MC is executed. The access operation referred to here is any of the read operation from the memory cell MC, the write operation to the memory cell MC, and the erase operation on the memory block MB. At this time, the number of times of executions of the access operation N1 is counted by the control circuit.

Next, in step S102, it is determined whether the number of times of executions of the access operation N1 is less than a certain value Na. The certain value Na is a preset value, for example, and is stored in the ROM fuse 12. Now, if N1<Na, then post-access operation processing finishes. On the other hand, if N1 Na, then processing shifts to step S103.

Finally, in step S103, faulty memory block processing is executed. Of course, in the case of setting Na=1, faulty memory block processing is executed every access operation. The faulty memory block processing includes steps S111 to S113 indicated as follows.

In the faulty memory block processing, first, in step S111, the leak current Ileak of the word line WL is detected by the leak current detecting circuit 2a. That detection result is outputted from the leak current detecting circuit 2a as the detection signal S1. The detection signal S1 may be a signal indicating a value of the leak current Ileak itself, or may be a binary (OK/NG) signal indicating a magnitude relationship of the leak current Ileak and the certain value Ya, for example. The certain value Ya is a preset value, for example, and is stored in the ROM fuse 12.

Next, in step S112, it is determined whether the leak current Ileak of the word line WL is smaller than the certain value Ya. Note that when the detection signal S1 is a binary (OK/NG) signal, it is determined whether the detection signal S1 is OK. Now, if Ileak<Ya (S1=OK), then the faulty memory block processing finishes. On the other hand, if Ileak≥Ya (S1=NG), then processing shifts to step S113.

Finally, in step S113, the memory block MB where leak current Ileak of the word line WL is large is registered in, for example, the management information storage region 1a of the memory cell array 1, as an access-prohibited region.

That concludes the operation flow including faulty memory block processing of the present embodiment.

In the case of the present embodiment, the faulty memory block processing is executed triggered by the access operation, specifically, based on the number of times of executions of the access operation, hence occurrence of a fatal situation such as data destruction caused by an increase in leak current of the word line can be avoided. In other words, the present embodiment makes it possible to provide a semiconductor memory device having high operational reliability after start of use by a user.

Note that in FIG. 7, the faulty memory block processing is executed based on the number of times of executions of the access operation, but in the case where, for example, the semiconductor memory device has a built-in timer, the faulty memory block processing may be executed based on a time, or based on the access operation and a time.

Second Embodiment

The first embodiment described a semiconductor memory device that executes faulty memory block processing based on the number of times of executions of the access operation. A second embodiment describes a semiconductor memory device that executes faulty memory block processing in combination with a post-read operation refresh operation. Note that below, points differing from the first embodiment will mainly be described.

Figure 9:
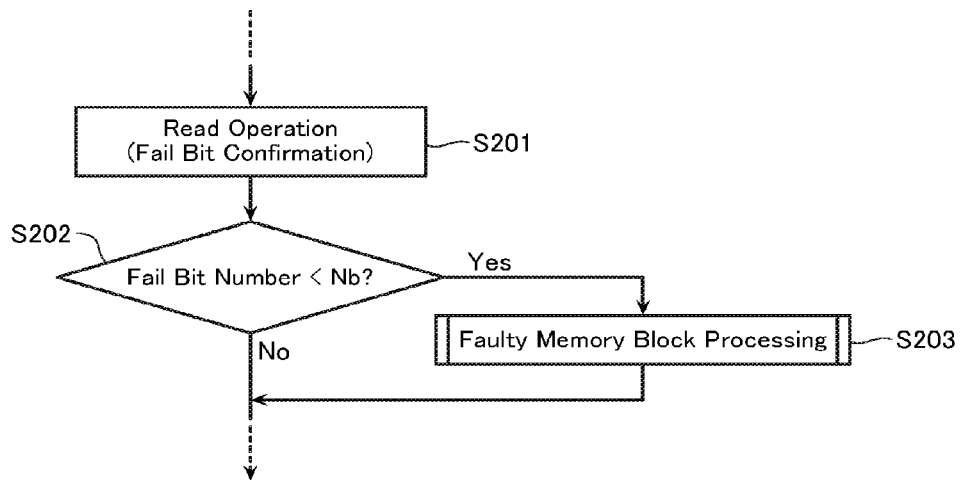
FIG. 9 is a flowchart including faulty memory block processing in a semiconductor memory device according to a second embodiment.
Figure 10:
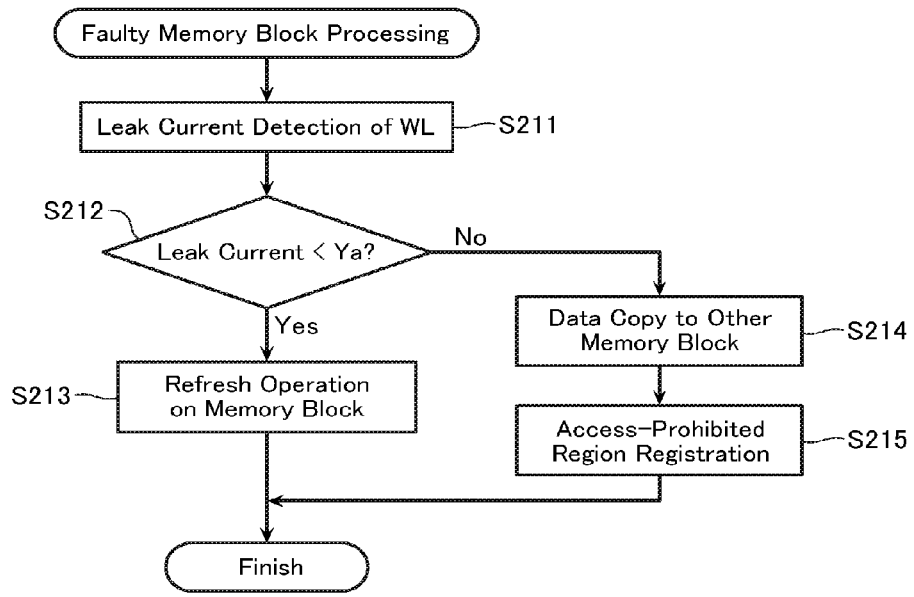
FIG. 10 is a flowchart of faulty memory block processing in the semiconductor memory device according to the same embodiment.

FIGS. 9 and 10 are flowcharts including faulty memory block processing in the semiconductor memory device according to the present embodiment. Now, description is made assuming the case where the memory block MB<0> has been selected as an example.

First, in step S201, the read operation on the memory cell MC is executed. At this time, the number of failed bits N2 included in read data is confirmed by the control circuit. Note that the fail bit number N2 may be aggregated in, for example, ECC frame units employed in an ECC (Error Checking and Correction) system possessed by the semiconductor device, or page units.

Next, in step S202, it is determined whether the fail bit number N2 is smaller than a certain value Nb. The certain value Nb is a value preset in view of the likes of capacity of the ECC system possessed by the semiconductor memory device, for example, and is stored in the ROM fuse 12. Now, if N2<Nb, then post-read operation processing finishes. On the other hand, if N2 Nb, then processing shifts to step S203.

Finally, in step S203, faulty memory block processing is executed. The faulty memory block processing includes steps S211 to S215 indicated as follows.

In the faulty memory block processing, first, in step S211, processing similar to that of step S111 is executed.

Next, in step S212, processing similar to that of step S112 is executed. Now, if Ileak<Ya (S1=OK), then processing shifts to step S213. Step S213 is processing in the case where although there are many failed bits in the memory block MB<0>, a cause thereof is not due to a structural defect of the memory block MB, but due simply to data corruption as a result of long-term neglect, and so on. On the other hand, if Ileak≥Ya (S1=NG), then processing shifts to step S214. Step S214 and following step S215 are processings in the case where there is not simply a problem of data corruption, but a structural defect has occurred in the memory block MB and there is a danger of data destruction, and so on.

Next, in step S213, data of the memory block MB<0> is rewritten to the same memory block MB<0>. In other words, a refresh operation on the memory block MB<0> is executed.

Next, in step S214, data of the memory block MB<0> is copied to a different memory block, for example, MB<1>. As a result, destruction of data stored in the memory block MB<0> is avoided.

Finally, in step S215, processing similar to that of step S113 is executed.

That concludes the operation flow including faulty memory block processing of the present embodiment.

In the case of the present embodiment, a cause of an error occurring in the memory block is determined based on the fail bit number of read data and the leak current of the word line, and different processings are executed depending on that cause. This makes it possible to provide a semiconductor memory device capable of faulty memory block processing more in accordance with a state of the memory block, compared to in the first embodiment where faulty memory block processing is executed based on the number of times of executions of the access operation.

[Others]

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device, comprising:
a memory cell array, the memory cell array including a memory block, the memory block including a memory cell, the memory cell including a semiconductor layer, a conductive layer, and a charge accumulation layer, the charge accumulation layer being disposed between the semiconductor layer and the conductive layer; and
a control circuit that executes an access operation on the memory cell,
the control circuit, triggered by the access operation, detecting a leak current of the conductive layer, and when the leak current is a certain value or more, executing a faulty memory block processing that registers as an access-prohibited region the memory block including the conductive layer, and
executing the faulty memory block processing based on the number of times of executions of the access operation.

2. The semiconductor memory device according to claim 1, wherein
the access operation is a read operation, a write operation, or an erase operation on the memory cell.

3. The semiconductor memory device according to claim 2, wherein
the control circuit confirms a fail bit number of data read from the memory cell during the read operation, and when the fail bit number is a certain value or more, executes the faulty memory block processing after the read operation.

4. The semiconductor memory device according to claim 3, wherein
during the faulty memory block processing, the control circuit rewrites data of the memory cell included in the memory block, when the leak current is lower than a certain value.

5. The semiconductor memory device according to claim 3, wherein
the memory cell array includes a plurality of the memory blocks, and
during the faulty memory block processing on a certain one of the memory blocks, the control circuit copies data of the memory cell of the certain memory block to a memory cell of another memory block, when the leak current is a certain value or more.

6. The semiconductor memory device according to claim 1, wherein
the memory cell array includes a management information storage region, and
during the faulty memory block processing, the control circuit registers the access-prohibited region in the management information storage region.

7. The semiconductor memory device according to claim 1, wherein
the control circuit includes a leak current detecting circuit that detects the leak current, and
during the faulty memory block processing, the leak current detecting circuit outputs a signal indicating a value of the leak current.

8. The semiconductor memory device according to claim 1, wherein
the control circuit includes a leak current detecting circuit that detects the leak current, and
during the faulty memory block processing, the leak current detecting circuit outputs a binary signal indicating whether the leak current is a certain value or more, or not.

9. The semiconductor memory device according to claim 1, wherein
the memory cell array is disposed on a semiconductor substrate, and
the semiconductor layer, the charge accumulation layer, and the conductive layer of the memory cell are disposed aligned in a normal direction of a principal plane of the semiconductor substrate.

10. The semiconductor memory device according to claim 1, wherein
the memory cell array is disposed on a semiconductor substrate,
the semiconductor layer of the memory cell is a columnar body extending in a normal direction of a principal plane of the semiconductor substrate, and
the semiconductor layer, the charge accumulation layer, and the conductive layer of the memory cell are disposed aligned in a horizontal direction to the principal plane of the semiconductor substrate.

11. A semiconductor memory device, comprising:
a memory cell array, the memory cell array including a memory block, the memory block including a memory cell, the memory cell including a semiconductor substrate, a floating gate, and a control gate, the floating gate being disposed on the semiconductor substrate, and the control gate being disposed facing an upper surface and a side surface of the floating gate; and
a control circuit that executes an access operation on the memory cell,
the control circuit, triggered by the access operation, detecting a leak current of the control gate, and when the leak current is a certain value or more, executing a faulty memory block processing that registers as an access-prohibited region the memory block including the control gate.

12. The semiconductor memory device according to claim 11, wherein
the access operation is a read operation, a write operation, or an erase operation on the memory cell.

13. The semiconductor memory device according to claim 11, wherein
the control circuit executes the faulty memory block processing based on the number of times of executions of the access operation.

14. The semiconductor memory device according to claim 12, wherein
the control circuit confirms a fail bit number of data read from the memory cell during the read operation, and when the fail bit number is a certain value or more, executes the faulty memory block processing after the read operation.

15. The semiconductor memory device according to claim 14, wherein
during the faulty memory block processing, the control circuit rewrites data of the memory cell included in the memory block, when the leak current is lower than a certain value.

16. The semiconductor memory device according to claim 14, wherein
the memory cell array includes a plurality of the memory blocks, and
during the faulty memory block processing on a certain one of the memory blocks, the control circuit copies data of the memory cell of the certain memory block to a memory cell of another memory block, when the leak current is a certain value or more.

17. The semiconductor memory device according to claim 11, wherein
the memory cell array includes a management information storage region, and during the faulty memory block processing, the control circuit registers the access-prohibited region in the management information storage region.

18. The semiconductor memory device according to claim 11, wherein
the control circuit includes a leak current detecting circuit that detects the leak current, and
during the faulty memory block processing, the leak current detecting circuit outputs a signal indicating a value of the leak current.

19. The semiconductor memory device according to claim 11, wherein
the control circuit includes a leak current detecting circuit that detects the leak current, and
during the faulty memory block processing, the leak current detecting circuit outputs a binary signal indicating whether the leak current is a certain value or more, or not.

* * * * *